United States Patent [19]

Mason

[11] Patent Number: 4,557,978

[45] Date of Patent: Dec. 10, 1985

[54] ELECTROACTIVE POLYMERIC THIN FILMS

[75] Inventor: James W. Mason, Huntington Beach, Calif.

[73] Assignee: Primary Energy Research Corporation, Torrance, Calif.

[21] Appl. No.: 560,601

[22] Filed: Dec. 12, 1983

[51] Int. Cl.[4] ............................................. B32B 15/04
[52] U.S. Cl. ...................................... 428/457; 73/649; 427/58; 427/79; 427/82; 427/86; 427/87; 427/255.6; 427/255.7; 427/385.5; 428/461; 528/289
[58] Field of Search ................. 428/457, 461; 427/82, 427/86, 87, 58, 255.6, 255.7, 385.5, 79; 73/649; 528/289

[56] References Cited

U.S. PATENT DOCUMENTS

| | | | |
|---|---|---|---|
| 3,677,829 | 7/1972 | Stefanye | 427/255.6 |
| 4,180,614 | 12/1979 | Angelo et al. | 427/255.6 X |
| 4,415,650 | 11/1983 | Kido et al. | 427/255.7 X |
| 4,448,803 | 5/1984 | Gauger et al. | 427/255.6 X |

Primary Examiner—Thomas J. Herbert
Attorney, Agent, or Firm—Marvin E. Jacobs

[57] ABSTRACT

Continuous polymer film of the polyacenequinone radical (PAQR) type, substrates coated with PAQR, and the method of coating a PAQR film comprising insister polymerization of at least on aromatic acene hydrocarbon monomer and at least one acidic monomer selected from di- or tri-aromatic anhydrides or derivatives thereof on a substrate by heating deposited monomers slowly under oxygen excluding conditions to a temperature of at least 300° C. and post-curing the formed film at a temperature above 300° C. thus forming a continuous, integral, pin-hole-free PAQR film on the substrate.

19 Claims, 7 Drawing Figures

ELECTROACTIVE POLYMERIC THIN FILMS

DESCRIPTION

1. Background of the Invention

This invention relates to electroactive polymers and, more particularly, this invention relates to continual, thin electroactive films of these polymers, to methods of forming the films and to electronic devices and instruments incorporating the films.

2. Description of the Prior Art

Organic molecular semiconductors of the polyacene quinone radical type (PAQR) have been extensively studied since they have exhibited promising electronic properties such as high dielectric constants of 50,000 and more at low frequencies, very high thermoelectric powers with several species as high as 350, and high conductivities for organic polymers.

The PAQR polymers are prepared by condensation polymerization of the monomers in the presence of large amounts of a Lewis acid catalyst, such as zinc chloride, to form black, insoluble, infusible, non-tractable powders. After recovery, the powders were extensively extracted with various solvents for periods of weeks in an attempt to remove the catalyst and any unreacted monomers. It cannot be determined if these extraneous materials have been removed and, if not, what effect they contributed to the physical and electronic properties of the polymer.

A further limitation of these polymers is that they cannot be practically formed into a useful shape. The powders do not dissolve and do not melt nor oxidize. The particles are extremely hard. Attempts to consolidate the powders into continuous film under pressure result in abrasion and wear of the anvils in a short period of time. The pressed films were weak, brittle, discontinuous and contained pinholes.

STATEMENT OF THE INVENTION

These limitations have been overcome in accordance with this invention by in situ formation of a continuous film of conductive polymer on a substrate. The substrate can have the shape of the desired device. The monomers are placed on the surface of the substrate and are polymerized, in situ to form a continuous, homogenous, pinhole-free film which is absent grain boundaries. The monomers can be simultaneously or serially deposited on the surface. Polymerization is initiated by radiant energy, such as heat, visible or U.V. light. Thus, a very pure form of polymer is formed since a chemical catalyst need not be present. Furthermore, since the ratio of monomers in the deposited film can be closely controlled, there is no unreacted monomer remaining after polymerization. Thus, the time-consuming extraction steps are avoided.

During the polymerization step, the adjacent monomers react and join to adjacent reacting monomers to form a macromolecular network of polymer in the form of a continuous film. The deposition process can be repeated and the layers polymerized to increase the thickness of the film. The electronic properties of the polymeric film are greatly enhanced by a post-polymerization curing treatment at a temperature of at least about 250° C., preferably at least 300° C.

The substrate can be an insulator or a conductor. The substrate is preferably very smooth and clean. Metallic substrates can be utilized and can then serve as one of the electrodes of an electronic device. The opposite electrode can be applied to the surface of the film to form an electronic device such as a capacitor.

The films are sensitive to pressure and to heat and can be utilized as pressure transducers and heat sensors and can be incorporated into pressure or temperature or heat sensing instruments or gauges. The films can be utilized in forming monopolar or bipolar plates for lightweight batteries, wire and cable sheathings and conductors, electromagnetic shields such as for computers and other electronic equipment and other applications. The film can be doped with ions such as silver, sodium, lithium and the like to increase conductivity of the film.

These and many other features and attendant advantages of the invention will become apparent as the invention becomes better understood by reference to the following detailed description when considered in conjunction with the accompanying drawings.

Figure 1:
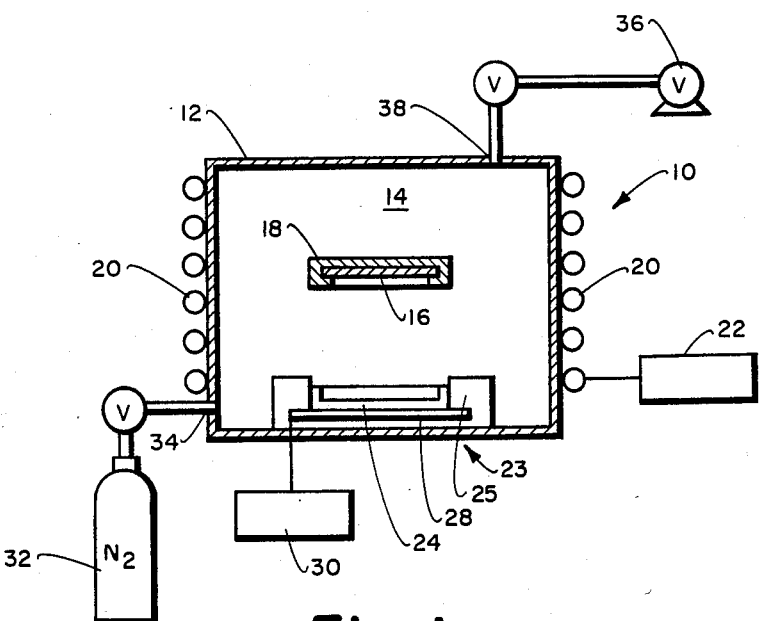
FIG. 1 is a schematic view of a deposition apparatus.

The films of the invention are formed of polymers of the polyacenequinone radical (PAQR) type. The polymer contains a fully eka conjugated, reasonably planar structure consisting of a series of variously fused benzenoid rings. The PAQR polymers are formed by condensation of an aromatic hydrocarbon or derivative thereof (an Acene) with an acidic compound such as anhydride or aroyl chloride. The $ZnCl_2$-catalyzed PAQR polymers form black, infusible, insoluble materials with a high degree of incompressibility indicative of a high degree of cross-linking. The polymers are believed to assemble in the solid to form a mass of random-packed, flat ribbons. Typical chain lengths are in the order of 200-500 Angstroms.

The process of the invention provides thin, continuous film of the PAQR polymers formed in situ on a surface. The PAQR type of polymer is a large class of polymers and numerous polymers have been polymerized and new polymers are being polymerized as new monomers are synthesized.

The acene monomer can be selected from compounds of the formula:

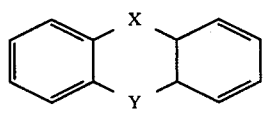

where
X is C, CH, C=O, C—N, N, S, O or a carbon-carbon bond and
Y is the same or different member selected from X, or the acene can be selected from compounds of the formula:

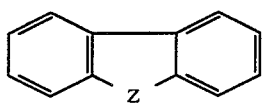

where Z is NH, O, S, CH, C=O, SO, SO$_2$.

Representative acene monomers are illustrated in the following Table:

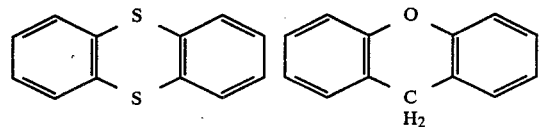

Thianthrene     Xanthene

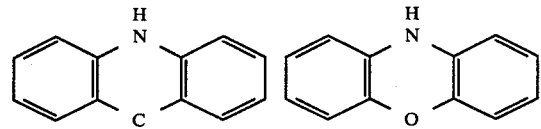

Acridone     Phenoxazine

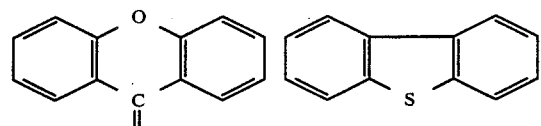

Xanthone     dibenzothiophene

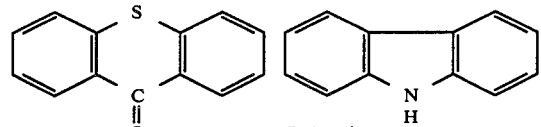

9-Thioxanthane     Carbazole

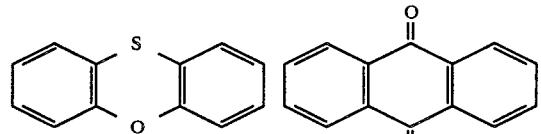

9-Thioxanthene     Anthroquinone

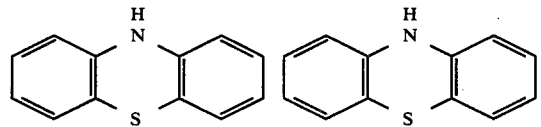

Phenathiazene     Phenathiazene

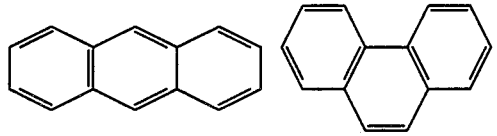

Anthracene     Phenanthrene

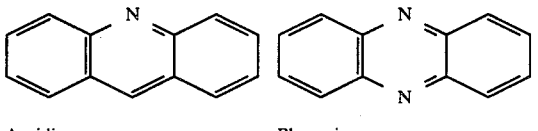

Acridine     Phenazine

The above illustrated acene monomers all contain 3 in-line ring structures. PAQR polymers can also be formed from acene monomers in which the three rings are in other configurations such as the following compounds:

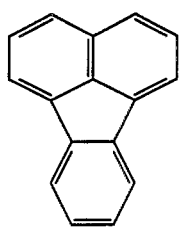

Fluoranthene

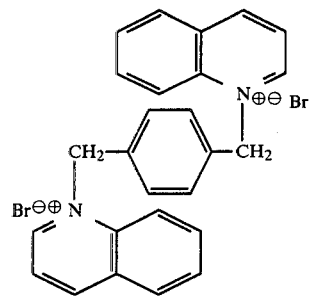

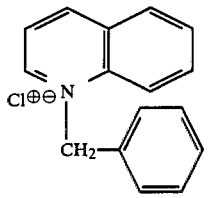

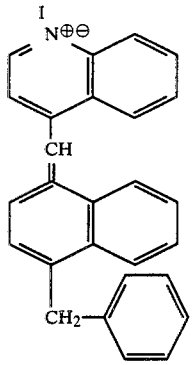

The anhydride is preferably a di- or tri-aromatic anhydride or derivative thereof, such as an acyl chloride, usually a monocyclic aromatic compound such as pyromellitic anhydride (PMA), mellitic trianhydride (MTA) or mellitic acid chloride (MTACl) of the following structure:

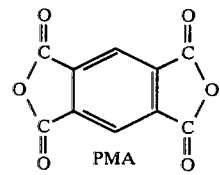

PMA

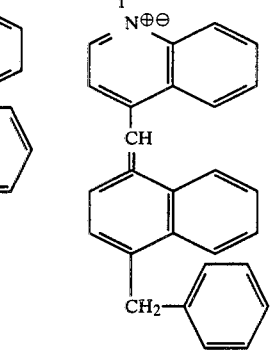

MTACl

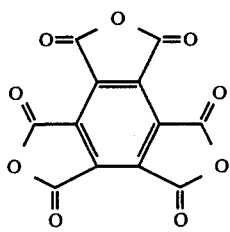

MTA

The acene and anhydride or acyl chloride condense to form a polymer containing units of the formulae:

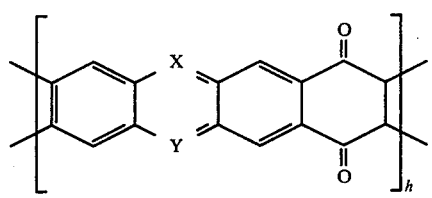

VII

OR

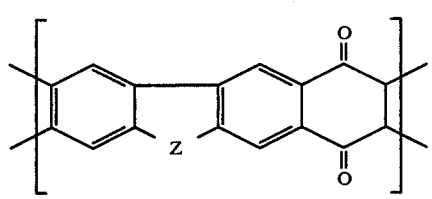

VIII

The thin films are formed according to the invention by laying down a thin film of vaporized monomer on the substrate. The chemical vapor deposition can be practiced under vacuum and can be assisted by application of heat, light or electromagnetic energy to the vapors or to the surface during deposition such as plasma, ultraviolet or visual light from a broad beam source or from a laser, or high energy can be applied to the deposited film to provide reactive sputtering to deeply implant the deposited molecules into an interface layer of the substrate. The vaporized molecules can be codeposited into a single film if the melting point and vaporization points are compatible. The substrate can then form an electrode. The films adhered well to metals such as copper, tantalum or molybdenum. The film could be stripped from substrates such as tungsten. Another way to recover the film would be to dissolve the substrate.

In the film produced by the process of this invention, the polymer molecules are believed to lay flat with the same orientation and to have less cross-linking. The molecules are physically separate and also are believed to be electronically separate since the film is prepared without zinc ions. The films produced by the invention exhibit a very high Dielectric Constant of at least $10^{10}$ with some film having a Dielectric Constant exceeding $10^{14}$. The Dielectric Constant is higher than the values reported for prior bulk PAQR materials indicating different molecular organization in the film. High conductivity approaching that of inorganic semiconductors ($10^{-3}$ mhos/cm) can be provided by doping the film with metals with a small atomic diameter such as Ag, Li, Na or B. These dopants can be applied either during formation of the film by inclusion in the monomers, or after it is formed by diffusion, ion implantation or ion exchange.

The process of the invention is practiced in a manner to produce pin-hole free PAQR films. Substantial shrinkage of the order of 60–70% occurs during polymerization. Therefore, each layer should be at least 0.1 microns in thickness. Though the individual layers can be fairly thick, the polymerization reaction period would be impractical. Therefore, it is preferred to limit each layer to less than 5 mm, preferably less than 1 mm. Thick polymer films can be prepared by laying down alternating, multiple layers of the monomers. The substrate should have a coefficient of expansion differing by not more than 20% the constant of the polymer film to prevent cracking of the film.

The multiple layers of monomers are first allowed to react to form a brightly colored comlex. The complex is then heated carefully under inert atmosphere to a temperature at which the monomers react but below a temperature at which the monomers or polymer would melt, evaporate or sublime. The substrate with the layers of monomers is heated, slowly and carefully for a period of at least 10 hours preferably over a period of at least 20 hours up to a temperature of 300° to 350° C. under nitrogen gas at a pressure near atmospheric of from 400 to 700 mn or higher while permitting a slow bleed of nitrogen. The complex layers partially polymerize. The film is then post-cured in air for at least 20 hours at a temperature above 300° C., such as 300°–400° C., usually from 310° to 360° C.

The deposition apparatus is similar to that used for vapor deposition of metals except that much higher pressures and much lower temperatures are utilized. Referring now to FIG. 1, the deposition apparatus 10 comprises an enclosure 12 forming a chamber 14 in which a substrate 16 such as a film of copper is mounted in a substrate holder 18. A heating means such as a coil 20 connected to controller 22 surrounds the chamber. A vaporization source 23 such as a base member 25 having a cavity for receiving a boat 24 is disposed in the chamber 14 below the substrate holder 18 such that the rising vapors impinge on the substrate 16. The base member may include a heating element 28 connected to controller 30 for vaporizing monomer in the boat 24. A source 32 of inert gas is connected to inlet 34 and a vacuum pump 36 is connected to an outlet 38. The polymerization and cure may both occur in the chamber 14 or the substrate 16 with the multiple layers can be removed, polymerized and cured in an oven or other apparatus.

Experiments were conducted in a standard vacuum deposition chamber. The layers of monomers were laid down on the substrate under high vacuum about 10 to 40 mm Hg of nitrogen. A copper substrate was mounted on a tungsten holder in the path of the vaporized monomer. Liquid monomers were recrystallized and/or sublimed until each had a melting range of 2° C. or less. Liquid monomers were placed in a boat 24 and vaporized.

Figure 2:
FIG. 2 is a sectional view of the substrate coated with multiple layers of monomers.

Referring now to FIG. 2, after a layer 40 of the first monomer had been formed, the boat 24 was removed from the chamber 14 and replaced with a boat containing the second monomer and vaporized to form a layer 42. In some experiments a third layer 44 of the first monomer was applied. The layers were each about 2 mils in thickness. Generally, a film of the acidic monomer was laid down first followed by one of the Acene monomers. The final layer was usually a layer of acidic monomer.

Complexation slowly occurs while the chamber is maintained at 20 mm Hg with nitrogen bleed over 20 hours. The layers slowly complex to form a brightly colored orange π-electron complex while shrinking about 60 to 70% in thickness.

After the complex has been formed, it is polymerized by raising the pressure to near atmospheric and heating the sample slowly to 100° C. and slowly furthur heating the sample according to the following schedule:

| Period, hr | T, °C. | Observation |
|---|---|---|
| 1 | 135 | brown-black film |
| 1 | 175 | starts to get shiny |
| 2 | 200 | |
| ½ | 225 | slow polymerization |
| ½ | 250 | |
| ½ | 275 | |
| ½ | 300 | |
| 20 | 300 | brown continuous film |

Figure 3:
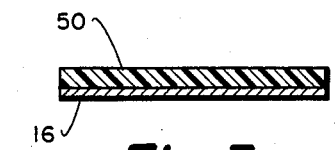
FIG. 3 is a view in section of the final film on a substrate.

The film is then post-cured in air for 48 hours at 315° to 325° C. to form a final polymerized film 50 as shown in FIG. 3.

EXAMPLE 1

PMA, carbazole and then PMA were laid down in individual layers about 2 mils in thickness under nitrogen atmosphere. The PMA boat was heated to 140° C. for 30 minutes with the chamber at a pressure of about 30 mm. A carbazole containing boat was then heated at 90° C. for about 1 hour with the chamber at 22 mm. Another PMA layer was then laid down.

The substrate with the three layers was maintained at 20 mm with nitrogen bleed for 20 hours and slowly complexed to a bright orange layer. The pressure was raised to near atmospheric and the complex layer was heated to 100° C. This temperature is just below the melting point of the lower melting monomer so that the layer polymerizes without melting. The complexed layers are than slowly heated to 300° C. over 8 hours according to the experimental schedule previously discussed.

Two-thirds shrinkage to a 2 mil brown film, well-bonded to the copper substrate occurs. The film was then post-cured in air for 48 hours at 315° C.

EXAMPLE 2

A copper substrate was coated with a layer of Anthracene from a boat heated at 100° for 10–15 minutes at about 100 mm followed by a layer of PMACl laid down from a boat heated at 220° C. for 30 minutes at 11 mm. After polymerization and cure according to the conditions of Example 1, a pin-hole-free film having a thickness of about 1 mil was formed adherent to the substrate.

EXAMPLE 3

Example 2 was repeated except that the deposition periods were tripled to form a 3 mil thick film of polymer.

EXAMPLE 4

Example 2 was repeated except that the deposition periods were doubled to form a 2 mil thick film.

Samples 7 mm in diameter for Examples 2, 3 and 4 and 0.02 inch square in area for Example 1 were tested using a Fluke 8050A DVM, a Leader LRC-740 bridge, a Wavetek 148 AM/FM/PM generator and in some cases a Tektronix oscilloscope was used as a null-detector. Resistance, capacitance and dissipation loss-factor were measured at 1, 10, 50 and 100 KHz frequencies. The data is presented in the following table:

TABLE 1

| Film Data | F (Hz) | C (mf) | D (ohms) | K' |
|---|---|---|---|---|
| Example 1 | | | | |
| PMA/Carbazole | 1000 | 1.2 | 17 | 540000 |
| .002" Thick | 10000 | .13 | 1.7 | 58000 |
| DC Res. = 1400 MOHM | 50000 | .022 | .268 | 9800 |
| | 100000 | .009 | .15 | 4000 |
| Example 2 | | | | |
| PMACl/Anthracene | 1000 | .044 | 47 | 20000 |
| .001" Thick | | | | |
| DC Res. = 500 MOHM | | | | |
| Example 3 | | | | |
| PMACl/Anthracene | 100 | | 8 | 9220 |
| .003" Thick | 1000 | | .42 | 3290 |
| DC Res. = 20 MOHM | 10000 | | .03 | 2050 |
| Example 4 | | | | |
| PMACl/Anthracene | 100 | | 5 | 1250 |
| .002" Thick | 1000 | | .19 | 711 |
| DC Res. = 20 MOHM | 10000 | | .003 | 608 |

The films exhibited high Dielectric Constants, K' which fall off with increasing frequency. The films of Example 1 have a Dielectric Constant of about 540,000 at 1000 Hz while BaTiO$_3$, the dielectric with the highest known value has a Dielectric Constant of only about 1000 to 3000 which does not change with frequency.

Figure 4:
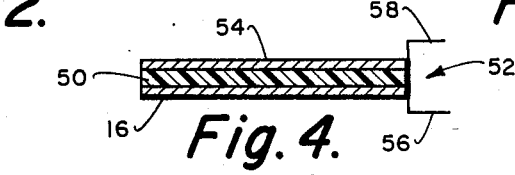
FIG. 4 is a view of a device utilizing the substrate as an electrode.

Referring now to FIG. 4, a capacitor 52 is formed by applying a film 54 of an electrode to the surface of the PAQR film 50. The film 54 can be metal or conductive polymer. The substrate 16 can function as the opposed electrode. Lead lines 56, 58 are connected to the electrodes 16, 54 to complete the device. A capacitor can also be fabricated by applying thin electrode films to each surface of the PAQR film and winding it into a spiral assembly.

Figure 5:
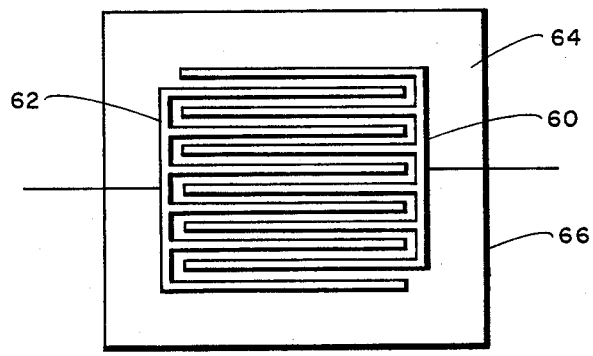
FIG. 5 is a front elevation view of a device having both electrodes applied to the film.

Both electrodes 60, 62 can be formed on the top surface 64 of the PAQR film 66 as shown in FIG. 5. The electrodes can assume different configurations such as two adjacent Z-shaped patterns. Changes in properties across the body of the film can be measured in this manner.

The PAQR films of the invention exhibit change in resistance with pressure, temperature or when placed within an electrical field. The change can be measured across the thickness or across the length of the PAQR film.

Figure 6:
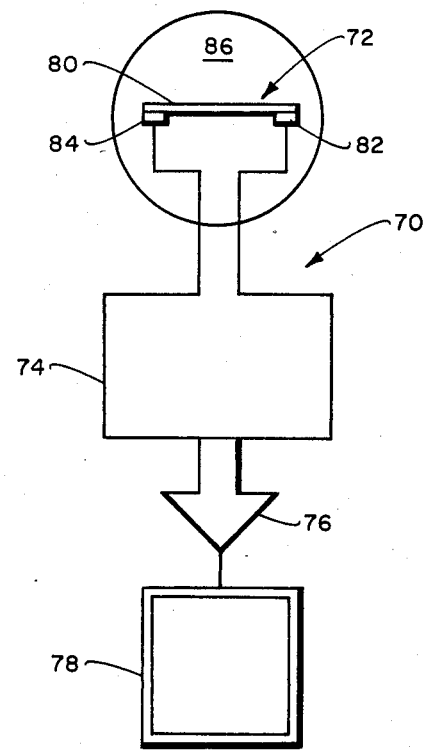
FIG. 6 is a schematic view of an instrument incorporating a sensor element prepared by means of the present invention.

Referring now to FIG. 6, an instrument 70 for measuring pressure or temperature changes is illustrated. The instrument includes a sensor 72, a bridge 74 or other means of processing the signal and comparing it to a reference value, an amplifier 76 and a data display or recording device 78 such as a CRT, meter or a strip chart recorder. The sensor 72 comprises a PAQR film 80 connected to edge electrodes 82, 84. The electrodes will measure expansion or contraction of the film 80 as it is placed in the environment 86 to be measured or when it is placed on a surface to be tested for expansion or contraction.

Figure 7:
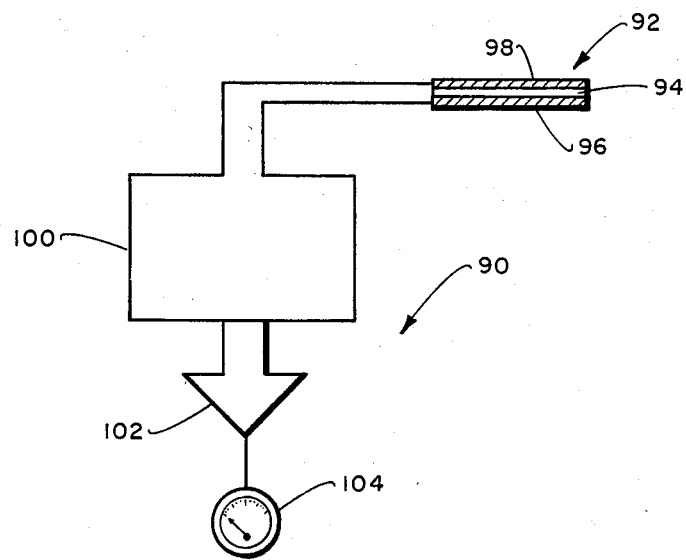
FIG. 7 is a schematic view of a further instrument.

The instrument 90 shown in FIG. 7 includes a sensor 92 which responds to changes in the thickness of the PAQR film 94. The change in thickness is sensed by electrodes 96, 98 and the signal is processed in processor 100 and amplified by amplifier 102 before display on the meter 104.

It is to be realized that only preferred embodiments of the invention have been described and that numerous substitutions, modifications and alterations are permissible without departing from the spirit and scope of the invention as defined in the following claims.

I claim:

1. A coated article comprising:
a substrate having at least one surface coated with an integral, homogeneous, continuous film of an in-situ polymerized PAQR polymer containing repeating units selected from:

[structure]

or

[structure]

where X is C, CH, C=O, C—N, N, S, O or a carbon-carbon bond, Y is the same or different member selected from X and Z is NH, O, S, CH, C=O, SO or $SO_2$.

2. An article according to claim 1 in which the substrate is a metal.

3. A method of forming a PAQR film comprising the steps of:
depositing a layer of precursor monomers on the surface of a substrate, said monomer comprising at least one aromatic acene hydrocarbon and at least one acidic monomer selected from di- or tri-aromatic anhydrides or derivatives thereof;
polymerizing the monomers in situ on said surface;
heating the layer slowly under oxygen excluding conditions to a temperature of at least 300° C. to form a PAQR film; and
post-curing the film at a temperature above 300° C. to form a continuous, integral, pin-hole-free PAQR film on said surface.

4. A method according to claim 3 in which the substrate has a coefficient of expansion differing by not more than 20% than the coefficient of expansion of the film.

5. A method according to claim 3 in which the substrate is metal.

6. A method according to claim 3 in which a plurality of layers of individual monomers are deposited sequentially by vapor deposition under reduced pressure.

7. A method according to claim 6 in which each layer is at least 0.1 microns thick.

8. A method according to claim 7 in which each layer is no more than 5 mm thick.

9. A method according to claim 3 in which the acidic monomer is selected from pyromellitic anhydride, mellitic trianhydride, pyromellitic acid chloride, or mellitic acid chloride.

10. A method according to claim 9 in which the acene monomer is carbazole and the acidic monomer is pyromellitic anhydride.

11. A method according to claim 3 in which the acene monomer is selected from a compound of the formula:

[structure]

where X is selected from C, CH, C=O, C—N, N, S, O or a carbon-carbon bond and Y is the same or a different member selected from X or a compound of the formula:

[structure]

where Z is selected NH, O, S, CH, C—O, SO, or $SO_2$.

12. A method according to claim 11 in which the acene is selected from thianthrene, xanthene, acridone, phenoxazine, xanthone, dibenzothiophene, 9-thioxanthane, carbazole, 9-thioxanthene, phenothiazine, anthraquinone, anthracene, phenanthrene, acridine and phenazine.

13. A method according to claim 11 in which the film is doped with metals selected from Ag, Li, Na or B to yield a higher conductivity film.

14. A method according to claim 13 in which the doped film is formed by inclusion of the metal ion in the layers of monomers used to form the film.

15. A method according to claim 13 in which the doped film is formed by diffusion of the metal ion into the film.

16. A method according to claim 13 in which the doped film is formed by implantation of the metal ion into the film.

17. A method according to claim 13 in which the doped film is formed by exchange of the metal ion with ions already existing in the film.

18. A film produced by the method of claim 3.

19. A continuous, integral, homogeneous film of PAQR formed by in-situ polymerization of monomers, said PAQR containing repeating units selected from

[structure]

or

[structure]

where X is C, CH, C=O, C—N, N, S, O or a carbon-carbon bond, Y is the same or different member selected from X and Z is NH, O, S, CH, C=O, SO OR $SO_2$.

* * * * *